(12) United States Patent
van der Schaar et al.

(10) Patent No.: US 6,704,089 B2
(45) Date of Patent: Mar. 9, 2004

(54) LITHOGRAPHIC PROJECTION APPARATUS, A METHOD FOR DETERMINING A POSITION OF A SUBSTRATE ALIGNMENT MARK, A DEVICE MANUFACTURING METHOD AND DEVICE MANUFACTURED THEREBY

(75) Inventors: Maurits van der Schaar, Veldoven (NL); Irwan D. Setija, Utrecht (NL); Everhardus C. Mos, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 144 days.

(21) Appl. No.: 09/842,203

(22) Filed: Apr. 26, 2001

(65) Prior Publication Data

US 2002/0006560 A1 Jan. 17, 2002

(30) Foreign Application Priority Data

Apr. 28, 2000 (EP) .............................. 00303610

(51) Int. Cl.$^7$ ........................ G03B 27/42; G01B 11/00
(52) U.S. Cl. ........................ 355/53; 356/399; 356/400; 356/401
(58) Field of Search ........................ 355/53, 55, 72; 356/399–401

(56) References Cited

U.S. PATENT DOCUMENTS

| | | | | |
|---|---|---|---|---|
| 4,862,008 A | * | 8/1989 | Oshida et al. | 250/548 |
| 5,004,925 A | * | 4/1991 | Takahashi et al. | 250/491.1 |
| 5,532,091 A | | 7/1996 | Mizutani | |
| 6,285,455 B1 | * | 9/2001 | Shiraishi | 356/486 |
| 6,320,242 B1 | * | 11/2001 | Takasu et al. | 257/529 |
| 2001/0007734 A1 | * | 7/2001 | Yoshida et al. | 430/22 |

OTHER PUBLICATIONS

J.A. Rogers et al., "A New Photoacoustic/Photothermal Device for Real–Time Materials Evaluation: An Automated means for Performing Transient Grating Experiments", PHYSICA B vols. 219 & 220 (1996), pp 562–564.

Lisa Dhar et al., "Moduli Determination in Polyimide Film Bilayer Systems: Prospects for Depth Profiling Using Impulsive Stimulated Thermal Scattering", J. Applied Physics vol. 77, No. 9, May 1, 1995, pp 4431–4444.

R. Logan et al., "Microelectronic Film Thickness Determination Using a Laser–Based Ultrasonic Technique", Materials Research Society Symposium Proc. Vol 440, vol. 1997.

\* cited by examiner

*Primary Examiner*—Russell Adams
*Assistant Examiner*—D. Ben Esplin
(74) *Attorney, Agent, or Firm*—Pillsbury Winthrop LLP

(57) ABSTRACT

Alignment to buried marks is carried out by using electromagnetic radiation to induce waves in the layers covering the buried layer. The acoustic or thermal waves cause reflectivity changes and displacements in the surface whose position and/or time dependence reveals the true position of the buried alignment mark. The buried alignment mark may be revealed by mapping the thickness of covering layers in its vicinity, e.g. by measuring the time dependence of the decay of a standing wave induced in the covering layers or by measuring the delay time of echoes of a travelling wave created at interfaces between different ones of the covering layers. Alternatively, a travelling wave can be created over the whole area of the mark so that echoes off the top and bottom of the buried mark carry positive and negative images of the mark; these cause reflectivity differences and displacements when they reach the surface which can be aligned to.

17 Claims, 4 Drawing Sheets

LITHOGRAPHIC PROJECTION APPARATUS, A METHOD FOR DETERMINING A POSITION OF A SUBSTRATE ALIGNMENT MARK, A DEVICE MANUFACTURING METHOD AND DEVICE MANUFACTURED THEREBY

BACKGROUND OF THE INVENTION

1. Field of the Invention

The present invention relates generally to the alignment of a substrate in a lithographic projection apparatus. More specifically, it relates to alignment of the substrate after some process layers have been deposited above an alignment mark.

2. Description of the Related Art

The term, "patterning means", "patterning structure" or "mask" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.
- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.
- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

A very important criterion in semiconductor manufactures is the accuracy with which the successive layers printed on the substrate are aligned with each other. Misalignments of the layers are referred to as overlay errors, for all the many layers required to make an integrated circuit the overlay errors must be kept within tight limits for the resulting device to function correctly. To correctly align the substrate to the mask and consequently minimize overlay errors, alignment marks, which generally take the form of diffraction gratings are etched in the bare silicon substrate. These alignment marks (referred to as "zero marks") are aligned to corresponding marks provided on the mask using a variety of techniques, including through the lens (TTL) alignment systems and off-axis alignment systems. An example of the latter is described in EP-A-0 906 590 (P-0070). However, once a few process layers have been deposited or grown on the substrate, the zero marks etched in the bare substrate often become obscured and are no longer visible to the radiation used in the alignment process. Even if not completely obscured, the growth of layers on top of the alignment marks can be uneven, leading to a shift in the apparent position of the alignment mark. To enable alignment after the zero marks have been obscured, further alignment marks are printed during the deposition of suitable layers of the device. The subsequent marks, referred to as non-zero marks, are however subject to damage during subsequent process steps and will also accumulate overlay errors from previous process layers. When etching a blanket aluminum layer to define the interconnects of the integrated circuit, it is preferred to align to the original zero marks but to do this requires that the overlying aluminum layers, and possibly also dielectric layers, be removed. Such clearout steps are undesirable.

A technique known as Impulsive Stimulated Thermal Scattering (ISTS) for measuring acoustic and thermal film properties, such as elastic constants and thermal diffusion rates, has been described in various publications such as J. A. Rogers et al., Appl. Phys. Lett 71 (2), 1997; A. R. Duggal et al. J. Appl. Phys. 72 (7), 1992; R. Logan et al., Mat. Res. Soc. Symp. Proc. 440, pg 347, 1997; L Dhar et al., J. Appl. Phys. 77 (9), 1995; and J. A. Rogers et al. Physica B 219 & 220, 1996. In this method, two excitation pulses overlapping in time and space are incident on a sample at slightly different angles. The two pulses interfere and heat the sample in a pattern corresponding to the interference pattern between them. The local heating sets up vibrations in the crystal structure of the sample which act as a diffraction grating to a probe pulse incident on the sample shortly after the excitation pulses. The diffraction of the excitation pulse is measured to give an indication of the property being investigated in the sample.

SUMMARY OF THE INVENTION

An object of the present invention is to provide an alignment system capable of alignment to alignment marks, e.g. formed directly in or on the substrate surface, even after they have been buried by subsequent process steps.

According to the present invention there is provided a lithographic projection apparatus including:

a radiation system for supplying a projection beam of radiation;

a support structure for supporting patterning means, the patterning means serving to pattern the projection beam according to a desired pattern;

a substrate table for holding a substrate;

a projection system for projecting the patterned beam onto a target portion of the substrate; and an alignment system for aligning the substrate to the patterning means, characterized by:

said alignment system comprising an excitation source for directing electromagnetic radiation to a surface of said substrate so as to induce a wave therein in a region of an at least partially buried substrate alignment mark; and a measurement system for directing a measurement beam to be reflected by said surface and for detecting surface effects caused by said wave thereby to perform an alignment to said substrate alignment mark.

The present invention uses acoustic or thermal waves induced in the process layers covering, or partially covering, a substrate alignment mark to reveal its true position. The substrate alignment mark may be one provided in or on the substrate itself or a deposited process layer. It thereby allows accurate alignment for critical process steps in a manufacturing procedure, without accumulating overlay errors from earlier steps and without the need for clearout steps on layer covering the mark. The waves cause surface displacement and reflection differences in the surface whose position and/or time dependence reveals the true position of the buried substrate alignment mark. The buried substrate alignment mark may be revealed by mapping the thickness of covering layers in its vicinity, e.g. by measuring the time dependence of the decay of a standing wave induced in the covering layers or by measuring the delay time of echoes of a travelling wave created at interfaces between different ones of the covering layers. Alternatively, a travelling wavefront can be created over the whole area of the mark so that echoes off the top and bottom of the buried mark carry positive and negative images of the mark; these cause surface displacement when they reach the surface which can be aligned to.

According to a further aspect of the present invention there is provided a method for determining a position of a substrate alignment mark, including:

inducing a wave in surface layers of a substrate at least partially covering the substrate alignment mark;

measuring surface effects of the surface of said substrate where said wave has been induced; and determining the position of said substrate alignment mark using the results of said step of measuring said surface effects.

The position of the buried substrate alignment mark may be determined with respect to the substrate or with respect to a table on which the substrate is positioned. This determined position may be used in a lithographic projection apparatus or in a monitoring apparatus for monitoring the quality of exposed substrates.

The present invention also provides a method of manufacturing a device including the method described above and further imaging irradiated portions of the mask onto target portions of the substrate.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "exposure area", respectively.

In the present document, the terms "radiation " and "beam" are used to encompass all types of electromagnetic radiation or particle flux, including, but not limited to, ultraviolet radiation (e.g. at a wavelength of 365 nm, 248 nm, 193 nm, 157 nm or 126 nm), extreme ultraviolet radiation (EUV), X-rays, electrons and ions. Also herein, the invention is described using a reference system of orthogonal X, Y and Z directions and rotation about an axis parallel to the I direction is denoted Ri. Further, unless the context otherwise requires, the term "vertical" (Z) used herein is intended to refer to the direction normal to the substrate or mask surface, rather than implying any particular orientation of the apparatus.

BRIEF DESCRIPTION OF THE DRAWINGS

The present invention will be described below with reference to exemplary embodiments and the accompanying schematic drawings, in which.

In the drawings, like references indicate like parts.

DETAILED DESCRIPTION OF THE INVENTION

Embodiment 1

Figure 1:
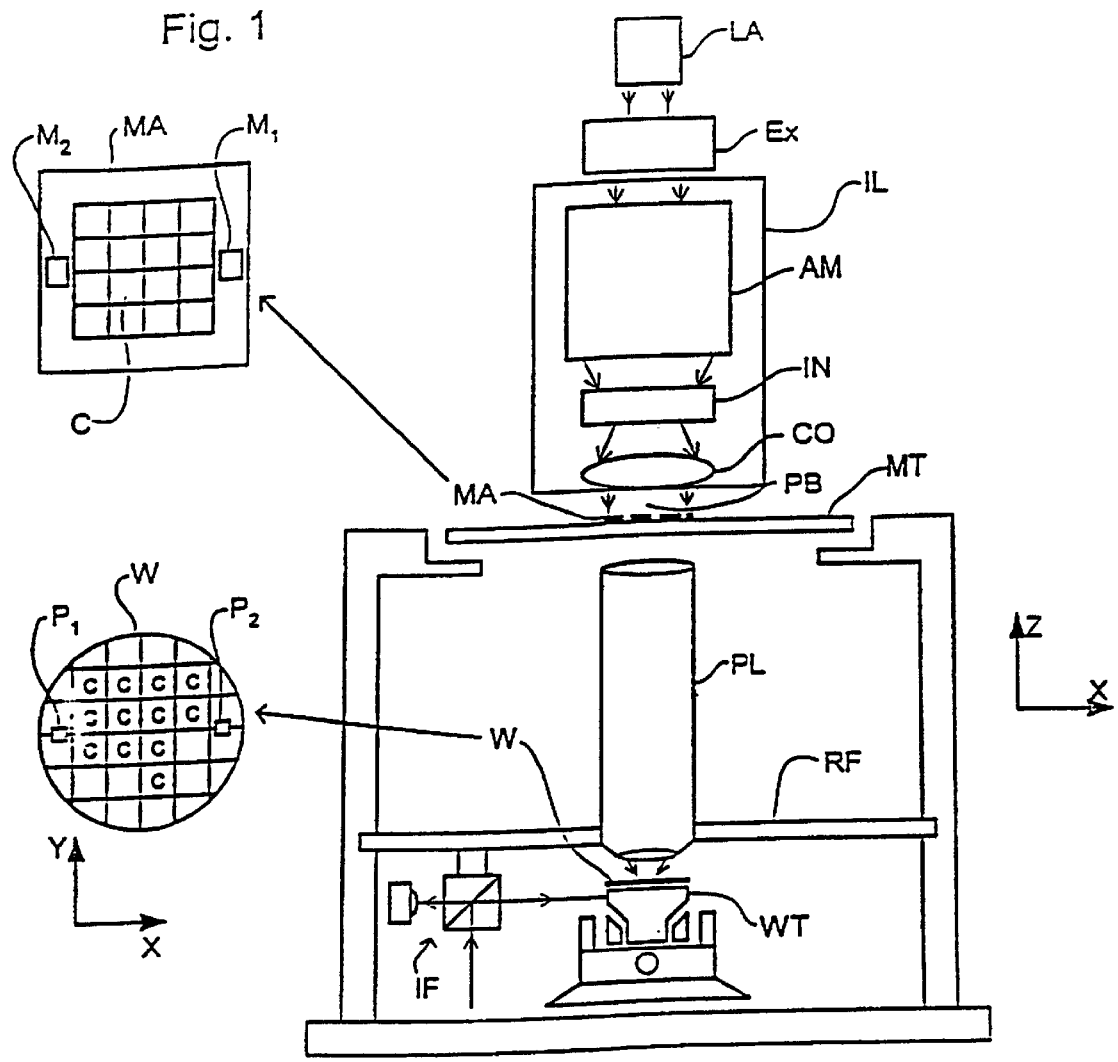
FIG. 1 depicts a lithographic projection apparatus according to a first embodiment of the invention.

FIG. 1 schematically depicts a lithographic projection apparatus according to a particular embodiment of the invention. The apparatus includes:

a radiation system Ex, IL, for supplying a projection beam PB of radiation (e.g. UV or EUV radiation). In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive or catadioptric system, a mirror group or an array of field deflectors) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning means, such as a programmable mirror array of a type as referred to above.

The source LA (e.g. a HG lamp, excimer laser, an undulator provided around the path of an electron beam in a storage ring or synchrotron, a laser plasma produced source, a discharge source or an electron or ion beam source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
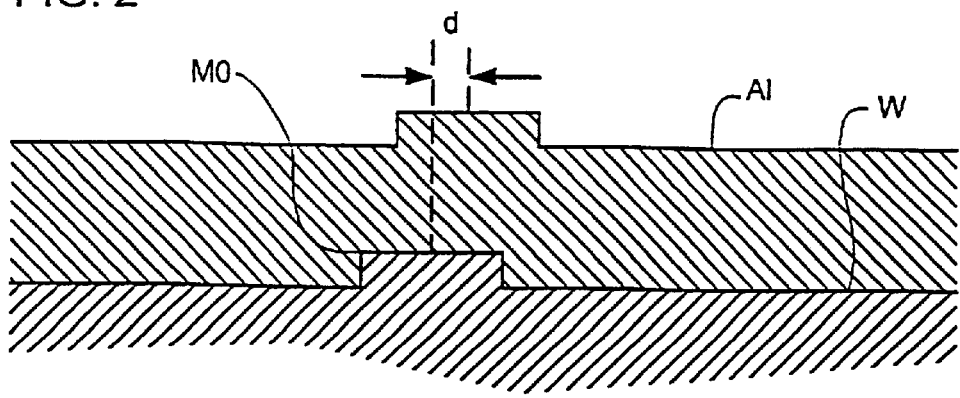
FIG. 2 depicts a zero mark on a wafer covered by an aluminum layer illustrating PVD induced alignment shift.

FIG. 2 shows a zero mark M0 etched in the substrate of wafer W and covered by an aluminum layer A1. If, as illustrated, the aluminum layer AL has been deposited at an angle on the zero mark M0, the center of the aluminum-covered mark is shifted relative to the center of the underlying zero mark M0 by an amount d. An alignment sensor effectively detects the position of the center of the mark and so will give a position shifted from the true position by an amount d. Where the mark is a grating, an alignment sensor effectively measures the average position of all the lines in the grating. However, since all the grating lines are close together, they will all have a similarly shifted aluminum deposition and so the average position will suffer from the same shift.

Figure 3:
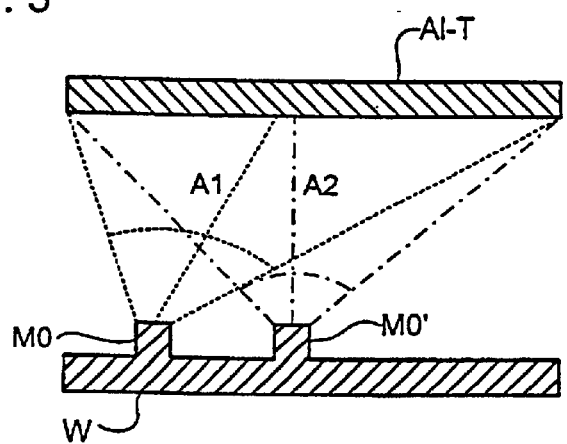
FIG. 3 is a view used in explaining the cause of PVD induced alignment shift.

A probable cause of asymmetric aluminum deposition in Physical Vapor Deposition (PVD) is shown in FIG. 3 in relation to a mark M0 near the edge of the wafer. In PVD, the aluminum layer grows by accretion of aluminum particles. As each particle is deposited, the layer will grow in the direction of incidence of that particle. Since the layer is built up from many particles, the net direction of growth of the layer will be related to the average direction of incidence of the particles making up the layer. As can be seen from FIG. 3, the average angle of incidence of particles on a mark M0 near the edge of the wafer will be an angle A1, which is somewhat inclined to the vertical, whereas the average angle of incidence A2 of particles on a mark M0' near the center of the wafer will be vertical or nearly so. Thus aluminum will grow on mark M0 at an angle toward the center of the wafer, resulting in an effective shift of the mark.

Figure 4:
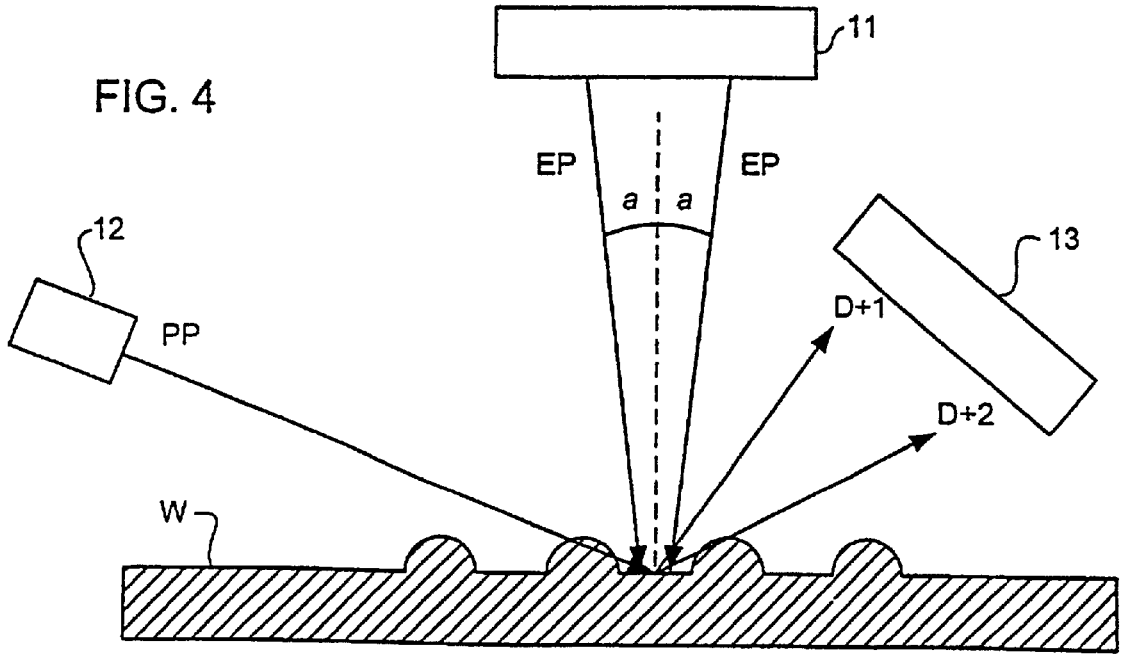
FIG. 4 depicts laser-induced surface gratings used in the first embodiment of the invention.

In the first embodiment of the invention, the thickness of the aluminum layer across the area of the mark is measured using an impulsive stimulated thermal scattering (ISTS) technique. This is illustrated in FIG. 4. Two excitation pulses EP are emitted by excitation source 11 and directed so as to be co-incident simultaneously on the wafer surface at a small angle a to the normal. The two excitation pulses EP are of sub-nanosecond duration, e.g. 400 ps, and excitation source 11 may be a passively Q-switched, single mode, Nd-YAG microchip laser pumped by a 1.2 W diode laser. The excitation pulse wavelength may be 1064 nm, for example. Suitable laser sources are described in J. J. Zayhowski, Laser Focus World, April 1996 pp 73–78, which document is incorporated herein by reference. In the film (aluminum layer), thermal expansion induced by the local heating of the film where the two excitation pulses constructively interfere induces acoustic and thermal responses, leading to the formation of a thermal grating. The acoustic waves are counter-propagating and damped so the thermal waves forming the grating are quasi-steady state material responses and persist until the thermal diffusion washes out.

While the thermal grating persists, a probe pulse PP is emitted by probe source 12, at a relatively large angle to the normal, so as to be diffracted by the thermal grating. The amount of diffraction of the probe pulse PP is detected by detector 13, which allows the state of the thermal diffraction grating to be monitored in real time. The probe source 12 may be an 860 nm diode laser operating in a quasi-continuous wave mode. The detector, and data recording/processing electronics have a nanosecond time resolution.

The excitation region is typically 25 μm×500 μm while the probe spot can be circular with 20 μm diameter, allowing several measurements to be taken from one excitation.

The fringe spacing of the induced grating depends only on the wavelength of the excitation pulses and the crossing angle a. The film acts as an acoustic waveguide, supporting waveguide modes whose displacements include both shear and compression. Each mode has a characteristic dispersion relation giving the acoustic velocity as a function of wave vector. Each mode has the same dependence on the wave vector and the film thickness; the dispersion relation is determined by the elastic modulus and density of the film and the underlying substrate. Since the properties of the, e.g. AlCu, film are known, in the invention, the time-dependent diffraction of the probe beam can be used to determine the acoustic frequency and hence film thickness.

Figure 5:
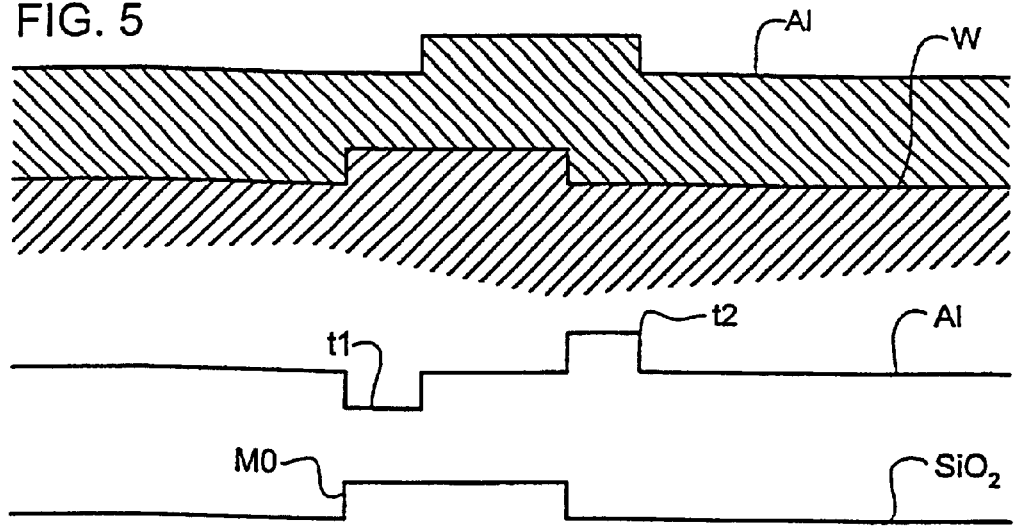
FIG. 5 depicts a zero mark on a wafer covered by an aluminum layer illustrating PVD induced alignment shift and the corresponding layer thickness.

A plurality of spaced apart film thickness measurements are taken along a line bisecting the alignment mark. As shown in FIG. 5, the thickness profile of the Al layer will show one thinner region, t1, and one thicker region, t2, either side of the zero mark M0. The thinner and thicker regions t1, t2 correspond to the Al deposits on zero mark M0 and their width will indicate the apparent alignment shift observed when aligning to the obscured mark. The determined widths can be used to correct an alignment carried out to the surface appearance of the mark.

Embodiment 2

In a second embodiment of the invention a different method is used to measure the film thickness, but otherwise the same principles apply. This method is illustrated in FIGS. 6A to 6D.

Figure 6A:
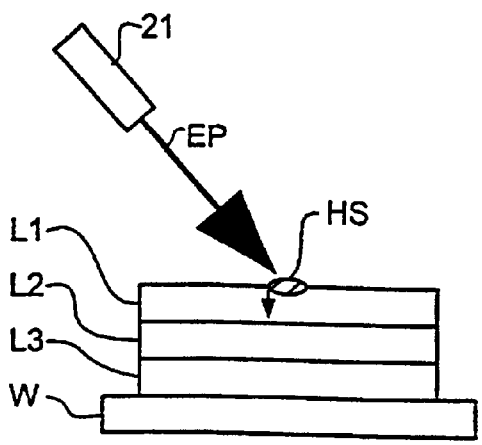
FIGS. 6A to 6D illustrate a thickness measurement technique used in a second embodiment of the invention.
Figure 6B:
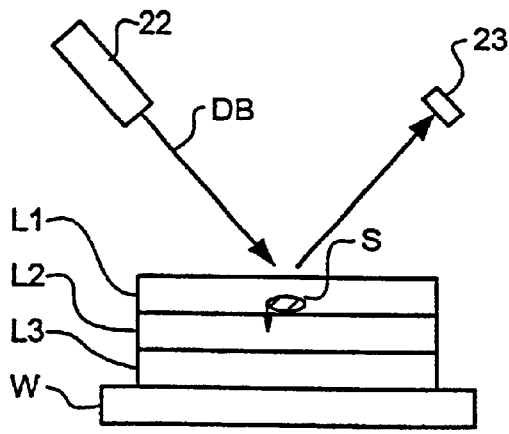

FIG. 6A shows pump source 21, which may be a TiS laser for example and emits ultra short excitation pulses EP, for example pulses of 150 fs duration at a frequency of 80 MHz, which are directed onto the wafer W where they instantaneously heat the surface of the uppermost layer L1 on the wafer at spot HS. The heating of the surface creates an acoustic wave S which propagates downwards into the layers L1, etc, deposited on the wafer substrate W, as shown in FIG. 6B. Meanwhile, detection beam source 22 directs detection beam DB onto the wafer surface where it is reflected to detector 23, whose output is a measure of the surface displacement of layer L1. The detection beam DB may be a delayed portion of the excitation pulses EP or may be generated by a separate source.

Figure 6C:
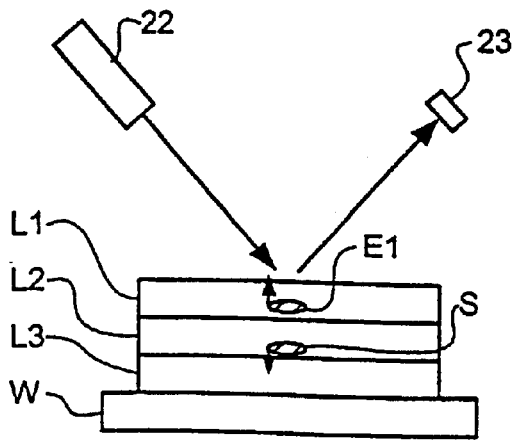
Figure 6D:
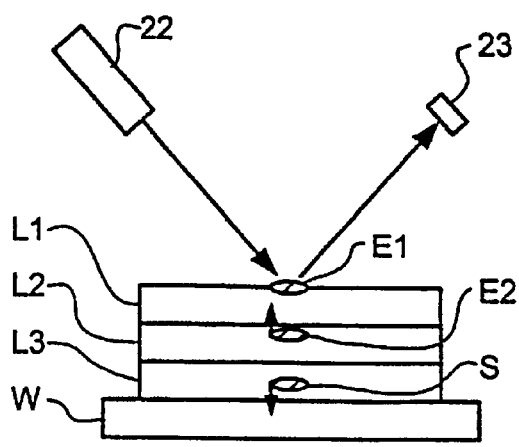

When the acoustic wave S reaches the first interface in the stack, between layers L1 and L2, a portion of the energy will be reflected back towards the surface, shown as echo E1 in FIG. 6C, while the attenuated acoustic wave S continues downwards. The proportion of energy reflected will depend on the acoustic impedances of the two layers. When echo E1 reaches the upper surface of the top layer L1 as shown in FIG. 6D, it will cause a displacement and a change in reflectivity of that surface. The change in reflectivity or the displacement is detected by detector 23. The sign and magnitude of the displacement will depend on the two materials meeting at the interface and factors such as the roughness of the interface (the local crystal structure). Of course, as the acoustic wave S propagates further down the layers deposited on the wafer, other echoes will be generated. FIG. 6D also shows echo E2 generated at the interface between layers L2 and L3.

The timing of the displacements and the changes in reflectivity are dependent on the speed of sound in the layers and the layer thickness; since the former are known the later can be calculated quite simply.

One could, for example, use a 15 femtosecond pulse EP of 5 nJ per pulse focussed down to a spot HS having a 20 μm diameter. This pulse is partly absorbed leading to an instantaneous, local heating of approximately 50 degrees on the surface of the toplayer L1. The pulse functions as a microscopic hammerblow giving an acoustic pulse S propagating further into the medium. The acoustic pulse is a strain pulse which means that over the pulsewidth the medium is slightly deformed with a relative length variation (or strain) $\Delta l/l$ in all directions. The maximum strain is equal to the thermal expansion at the start ($\Delta l/l = \beta^* \Delta T$ where $\beta = 2.3*10^{-5} K^{-1}$ is the thermal expansion coefficient of aluminum). The strain pulse is partially reflected from every interface including the interface between the deposited layer L3 and the wafer W where the buried mark is etched. The reflected pulse returns to the surface of the top layer L1 where it will give a surface displacement and a variation in reflection. This can be measured with a detection beam source 22 and detector 23. The coefficient of surface reflection per unit strain for aluminum is approximately $2*10^{-3}$. The maximum change in surface reflection is then $2*10^{-3}*\beta*\Delta T \approx 10^{-6}$. The surface displacement is equal to the maximum strain times the pulse length: $\beta^*\Delta T^*\xi \approx 10^{-11}$ wherein $\xi$ is the absorption length (15.1 nm). It must be noted that this calculation model assumes no energy losses, however it is expected that energy losses will occur and therefore the measured changes in reflectivity and surface displacement will be smaller.

In variations of the second embodiment, the displacement data can be processed to compensate for a relatively large spot size, and the spot size can be reduced using a second grating to blade part of the mark structure.

Embodiment 3

In a third embodiment of the invention, the buried mark is acoustically revealed on the surface of the covering layers and can then be directly aligned to. The procedure for this is shown in FIGS. 7A to 7E.

Figure 7A:
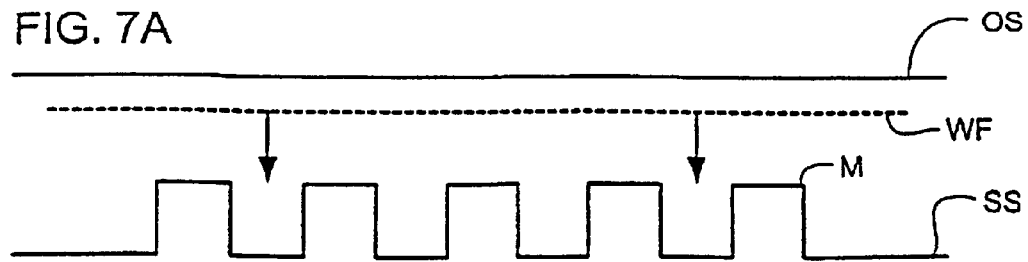
FIGS. 7A to 7E illustrate the procedure for revealing a buried mark of a third embodiment of the invention.
Figure 7B:
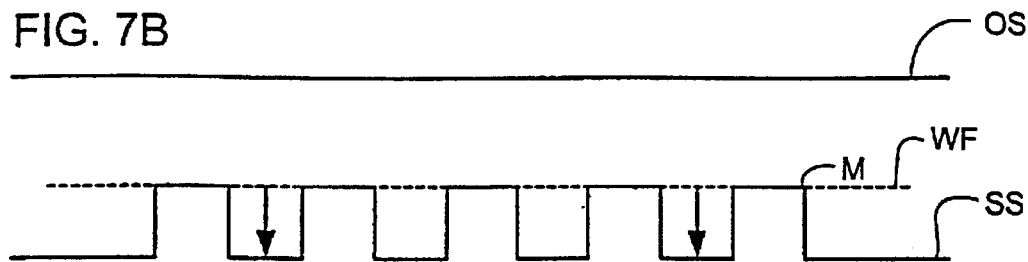
Figure 7C:
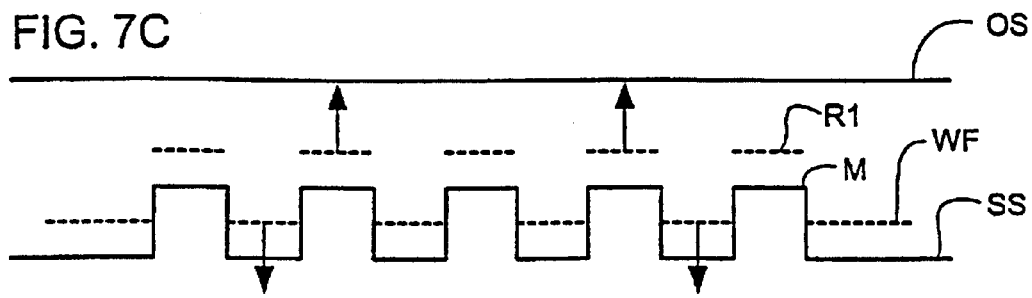

First, the outer surface OS of the deposited layer or layers covering the mark M is excited using a short pulse laser, for example of the type described above, over the whole area of the buried mark M. This generates an acoustic wavefront WF which propagates downwards through the covering layers, as shown in FIG. 7A. When the wavefront WF meets the level of the top of the buried mark M, as shown in FIG. 7B, reflections will be generated only in the areas where the mark is raised. Thus the first reflection R1 which returns towards the outer surface OS will carry an image of the buried mark. The remainder of the wavefront WF continues to propagate downwards in the etched area of the mark M. This is the situation shown in FIG. 7C.

Figure 7D:
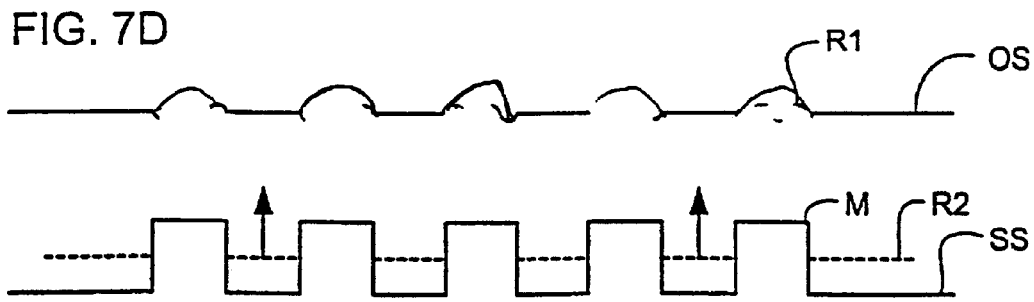

When the first reflection R1 reaches the outer surface OS, as shown in FIG. 7D, the surface will be displaced and the reflectivity will be changed in a pattern corresponding to the buried mark M. The displacements and the difference in reflectivity between the displaced and not-displaced areas of the surface form a diffraction grating which diffracts the alignment beam in the same way as the mark M itself. An alignment can then be carried out to the acoustic representation of the buried mark M.

Figure 7E:
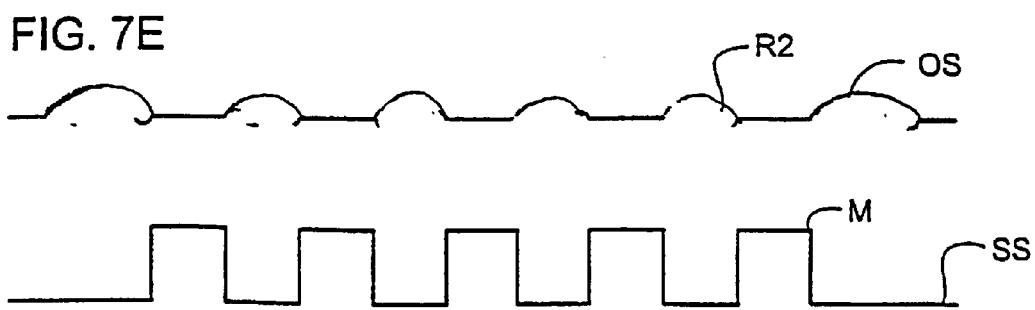

A second alignment is also possible using the second reflection R2, that is, a negative image of the mark may be used instead of, or in addition to, the positive image as described above. This is reflected by the etched away portions of the mark M and reaches the outer surface OS a short time after the first reflection RI. The time delay will depend on the depth of mark M and the speed of sound in the covering layers. FIG. 7E shows how the second reflection displaces the outer surface OS in a grating pattern that is the negative of the mark M but can be aligned to in a similar manner.

Of course, the excitation and alignment process can be repeated as often as required to complete an alignment process to the desired accuracy.

In a variation of the third embodiment, the femtosecond laser used to excite the acoustic travelling wave in the layer(s) covering the buried mark is replaced by a less-expensive amplitude-modulated (semi-) continuous laser. The amplitude modulation of the continuous laser is arranged so as to periodically excite the surface layer in-phase with the returning acoustic waves from the spaces of the buried mark and 180° out of phase with the acoustic wave returning from the lines of the buried mark and from the bulk material. The acoustic projection of the mark on the surface, defined by reflectivity changes, then has a good contrast and can be aligned to easily. In the case of a mark buried at a depth of 120 nm in material with a speed of sound of 2.4 km/s, the modulation frequency is of the order of $(2.4 \times 10^3 / 240 \times 10^{-9})$ Hz=10 GHz. This can easily be achieved with electro-optical modulators that can be tuned as appropriate for different depths of the buried mark and different covering materials.

Embodiment 4

In a fourth embodiment, the buried mark is revealed by probing the surface of the substrate with a thermal wave. A thermal wave is defined as a harmonically varying temperature distribution in a medium, generated by illumination of the surface with a harmonically modulated intensity from, for example, a harmonically modulated CW laser. One of the advantages of thermal waves is that an intensity modulated CW laser is much cheaper and easier to implement than a high power pico- or femtosecond laser as is used as a source for acoustic waves.

A thermal wave is not a wave in the classical sense, it is a solution of a diffusion equation with a harmonically varying source term and not of the wave equation. It has no wavefront and no reflection and refraction at an interface because it has no directionality. The thermal distribution in a multilayer configuration will be determined by the thermal diffusion length in the separate layers. With a thermal wave the thermal properties of the medium will be measured while with an acoustic wave the mechanical (elastic) properties of the sample will be measured. The harmonically varying source can be used as an alternative to the excitation source 11 in FIG. 4, the pump source 21 of FIG. 6A, or may be used to excite the outer surface OS in FIG. 7. Just like acoustic waves, thermal waves lead to reflectance variation and displacements of the surface that can be measured.

Aluminum and silicon have a much higher thermal conductivity and therefore a much higher thermal diffusion length than silicon oxide that is an effective thermal insulator. This is advantageous, since we may like to measure a mark present in a substrate of silicon that is buried under a first layer of silicon oxide and a top layer of aluminum. The silicon oxide will function as an effective thermal insulator so that the temperature increase for the aluminum top layer will be relatively high. For example, it is possible to measure a temperature increase for the aluminum layer of 100 degrees for an absorbed power of 10 mW over a 10 µm spot size with a 100 kHz intensity modulation frequency. The diffusive character of the thermal waves makes that the thermal diffusion length is inverse proportional to the modulation frequency. The heating of the aluminum surface is 30 degrees at 1 MHz and 2 degrees at 10 MHz. The increase in temperature will lead to a large thermal expansion and a strain (a relative length variation $\Delta l/l$) of $\beta^* \Delta T$ where $\beta 2.3*10^{-5} K^{-1}$. The wafer will be harmonically expanding and shrinking only limited by the boundary condition that the strain at the backside of the wafer where the wafer is fixed to the substrate table must be zero. The aluminum surface displacement is $0.5^* \beta^* \Delta T^* d_w \approx 1 \mu m$ where $d_w$ is the wafer thickness The difference in temperature of the lines and the spaces of the buried mark may be 10 degrees, leading to a difference in surface displacement of 100 nm, a height profile that can be easily measured by a sensor.

The surface displacement using a thermal wave is much higher and therefore easier to measure than for an acoustic wave. So by measuring a height profile that is created by probing a buried mark with a thermal wave we can measure the position of said mark. It is also possible to measure the reflectance variation that is caused by the 10 degrees temperature difference. Having a reflectance temperature coefficient of $3.7*10^{-5} K^{-1}$ the reflectance variation will be $3.7*10^{-4}$. Again it must be noted that this calculation model assumes no energy losses, however it is expected that energy loses will occur and therefore the measured changes in reflectivity and the surface displacement will be smaller.

While we have described above specific embodiments of the invention it will be appreciated that the invention may be practiced otherwise than as described. The description is not intended to limit the invention. In particular, it will be appreciated that while the invention has been described in terms of alignment to buried zero marks, it can of course be used in alignment to any buried mark or feature.

What is claimed is:

1. A lithographic projection apparatus comprising:
   a radiation system constructed and arranged to supply a projection beam of radiation;
   a support structure constructed and arranged to support beam patterning structure, the beam patterning structure serving to pattern the projection beam according to a desired pattern;
   a substrate table constructed and arranged to hold a substrate;
   a projection system constructed and arranged to project the patterned beam onto a target portion of the substrate; and
   an alignment system to align the substrate to the beam patterning structure,
   said alignment system comprising:
      an excitation source for directing electromagnetic radiation to a surface of said substrate so as to induce a wave therein in a region of an at least partially buried substrate alignment mark; and
      a measurement system to direct a measurement beam to be reflected by said surface and to detect surface effects caused by said wave thereby to perform an alignment to said substrate alignment mark.

2. Apparatus according to claim 1, wherein:
   said excitation system is arranged to induce waves in said substrate at a plurality of points; and
   said measurement system is arranged to detect surface effects at said plurality of points to generate thickness data relating to thickness of at least one layer covering said substrate alignment mark and to correct an alignment process carried out using a surface pattern induced by said substrate alignment mark.

3. A lithographic projection apparatus comprising:
   a radiation system constructed and arranged to supply a projection beam of radiation;
   a support structure constructed and arranged to support beam patterning structure, the beam patterning structure serving to pattern the projection beam according to a desired pattern;
   a substrate table constructed and arranged to hold a substrate;
   a projection system constructed and arranged to project the patterned beam onto a target portion of the substrate; and
   an alignment system to align the substrate to the beam patterning structure,
   said alignment system comprising:
      an excitation source for directing electromagnetic radiation to a surface of said substrate so as to induce a wave therein in a region of an at least partially buried substrate alignment mark; and
      a measurement system to direct a measurement beam to be reflected by said surface and to detect surface effects caused by said wave thereby to perform an alignment to said substrate alignment mark,
      wherein said excitation source is a laser constructed and arranged to emit pulses shorter than 1 nanosecond to induce an acoustic wave in at least one covering layer obscuring said substrate alignment mark.

4. Apparatus according to claim 3, wherein said excitation source is arranged to irradiate a measurement area with two temporally coincident overlapping excitation pulses having mutually different angles of incidence, thereby to induce a standing acoustic wave pattern in the surface of said substrate; and said measurement beam is to be diffracted by said standing wave pattern and the measurement system detects the time-dependent diffraction of said measurement beam.

5. Apparatus according to claim 3, wherein said excitation source is arranged to irradiate a measurement area with an excitation pulse or pulse train so as to generate an acoustic travelling wave propagating into said substrate; and said measurement system further comprises a measurement beam source to direct a measurement beam to be reflected by the surface of said substrate and a detector for detecting time-dependent surface effects of said surface of said substrate caused by returning echoes of said travelling wave.

6. Apparatus according to claim 3 wherein said excitation source is arranged to irradiate said region so as to induce an acoustic travelling wave in at least one covering layer obscuring said substrate alignment mark so as to be selectively reflected by said substrate alignment mark; and said alignment system further comprises an alignment beam source to direct an alignment beam to be diffracted by images of said substrate alignment mark formed in the surface of said covering layer by returning echoes of said substrate alignment mark.

7. A lithographic projection apparatus comprising:
   a radiation system constructed and arranged to supply a projection beam of radiation;
   a support structure constructed and arranged to support beam patterning structure, the beam patterning structure serving to pattern the projection beam according to a desired pattern;
   a substrate table constructed and arranged to hold a substrate;
   a projection system constructed and arranged to project the patterned beam onto a target portion of the substrate; and
   an alignment system to align the substrate to the beam patterning structure,
   said alignment system comprising:
      an excitation source for directing electromagnetic radiation to a surface of said substrate so as to induce a wave therein in a region of an at least partially buried substrate alignment mark; and
      a measurement system to direct a measurement beam to be reflected by said surface and to detect surface effects caused by said wave thereby to perform an alignment to said substrate alignment mark, wherein said excitation source is a modulated continuous wave source which is constructed and arranged to emit a harmonically varying beam of radiation so as to induce a thermal wave in the at least one covering layer obscuring said substrate alignment mark.

8. Apparatus according to claim 7, wherein said wave source is a continuous wave laser.

9. Apparatus according to claim 7, wherein said wave source is modulated with a frequency lower than 10 MHz.

10. Apparatus according to claim 1, wherein said measurement system is constructed and arranged to measure changes in reflection of the surface of said wafer caused by waves induced by the excitation source.

11. Apparatus according to claim 1, wherein said measurement system is constructed and arranged to measure displacements of the surface of said wafer caused by waves induced by the excitation source.

12. Apparatus according to claim 1, wherein the support structure comprises a mask table to hold a mask.

13. Apparatus according to claim 1 wherein the radiation system comprises a radiation source.

14. A lithographic projection apparatus comprising:

a radiation system constructed and arranged to supply a projection beam of radiation;

a support structure constructed and arranged to support beam patterning structure, the beam patterning structure serving to pattern the projection beam according to a desired pattern;

a substrate table constructed and arranged to hold a substrate;

a projection system constructed and arranged to project the patterned beam onto a target portion of the substrate; and an alignment system to align the substrate to the beam patterning structure, said alignment system comprising:

an excitation source for directing electromagnetic radiation to a surface of said substrate so as to induce a wave therein in a region of an at least partially buried substrate alignment mark; and a measurement system to direct a measurement beam to be reflected by said surface and to detect surface effects caused by said wave thereby to perform an alignment to said substrate alignment mark, wherein said at least partially buried substrate alignment mark is buried in a process layer.

15. A lithographic projection apparatus according to claim 14, wherein said process layer comprises at least one of a conductor layer and a dielectric layer of a circuit pattern.

16. A lithographic projection apparatus according to claim 14, wherein said process layer comprises a plurality of process layers.

17. A lithographic projection apparatus comprising:

a radiation system constructed and arranged to supply a projection beam of radiation;

a support structure constructed and arranged to support beam patterning structure, the beam patterning structure serving to pattern the projection beam according to a desired pattern;

a substrate table constructed and arranged to hold a substrate;

a projection system constructed and arranged to project the patterned beam onto a target portion of the substrate; and an alignment system to align the substrate to the beam patterning structure, said alignment system comprising:

an excitation source for directing electromagnetic radiation to a surface of said substrate so as to induce a wave therein in a region of an at least partially buried and obscured substrate alignment mark; and a measurement system to direct a measurement beam to be reflected by said surface and to detect surface effects caused by said wave thereby to perform an alignment to said substrate alignment mark.

* * * * *